(12) United States Patent
Wisniewski

(10) Patent No.: US 8,599,573 B2
(45) Date of Patent: Dec. 3, 2013

(54) WALL BOX DIMMER

(75) Inventor: Stanley Wisniewski, Pompton Plains, NJ (US)

(73) Assignee: Crestron Electronics Inc., Rockleigh, NJ (US)

( * ) Notice: Subject to any disclaimer, the term of this patent is extended or adjusted under 35 U.S.C. 154(b) by 0 days.

(21) Appl. No.: 13/406,707

(22) Filed: Feb. 28, 2012

(65) Prior Publication Data

US 2012/0160641 A1    Jun. 28, 2012

Related U.S. Application Data

(63) Continuation of application No. 12/389,807, filed on Feb. 20, 2009, now Pat. No. 8,149,591.

(51) Int. Cl.
*H05K 7/02* (2006.01)
*H05K 7/04* (2006.01)

(52) U.S. Cl.
USPC ........................................... 361/810

(58) Field of Classification Search
USPC .................. 361/810, 730, 752, 796, 800–803
See application file for complete search history.

(56) References Cited

U.S. PATENT DOCUMENTS

| | | |
|---|---|---|
| 4,529,951 A | 7/1985 | Youichi |
| D285,066 S | 8/1986 | Liss et al. |
| D287,242 S | 12/1986 | Liss et al. |
| 4,716,357 A | 12/1987 | Cooper |
| 4,728,866 A | 3/1988 | Capewell |
| 4,876,498 A | 10/1989 | Luchaco |
| 4,888,494 A | 12/1989 | McNair et al. |
| 4,954,768 A | 9/1990 | Luchaco et al. |
| D311,382 S | 10/1990 | Mayo et al. |
| D311,485 S | 10/1990 | Jacoby et al. |
| D311,678 S | 10/1990 | Graef et al. |
| D313,738 S | 1/1991 | Mayo et al. |
| D319,429 S | 8/1991 | D'Aleo et al. |
| D327,255 S | 6/1992 | D'Aleo et al. |
| D336,744 S | 6/1993 | Kahn et al. |
| 5,260,669 A | 11/1993 | Higgins et al. |
| D344,264 S | 2/1994 | D'Aleo et al. |
| 5,289,043 A | 2/1994 | Marshall et al. |
| 5,293,308 A | 3/1994 | Boys et al. |
| D353,798 S | 12/1994 | Bryde et al. |
| 5,399,926 A | 3/1995 | Adams et al. |
| 5,430,356 A | 7/1995 | Ference |
| 5,463,286 A | 10/1995 | D'Aleo et al. |
| 5,608,196 A | 3/1997 | Hall et al. |
| 5,670,858 A | 9/1997 | Heath |
| D389,461 S | 1/1998 | Mayo et al. |
| D389,805 S | 1/1998 | Mayo et al. |

(Continued)

OTHER PUBLICATIONS

Crestron Electronics, Inc., Cameo Keypads Operations and Installation Guide, Feb. 2006, pp. front, cover, i, 1-8, rear cover.

(Continued)

*Primary Examiner* — Javaid Nasri
(74) *Attorney, Agent, or Firm* — Crestron Electronics Inc.

(57) ABSTRACT

A dual function air-gap switch actuator (26) is incorporated into the generally planar face of a wall box dimmer. The switch actuator is finger operated and provides both a main power disconnect via air-gap contacts (211) and the means (212) to activate a secondary function. The dual function air-gap switch actuator is optionally fitted with an indicator lamp (265).

5 Claims, 10 Drawing Sheets

(56) References Cited

U.S. PATENT DOCUMENTS

| | | | |
|---|---|---|---|
| D395,037 S | 6/1998 | Mayo et al. | |
| D404,013 S | 1/1999 | Mayo et al. | |
| 5,903,139 A | 5/1999 | Kompelien | |
| D412,315 S | 7/1999 | Mayo et al. | |
| 5,982,103 A * | 11/1999 | Mosebrook et al. | 315/149 |
| D421,246 S | 2/2000 | Mayo et al. | |
| D422,567 S | 4/2000 | Mayo et al. | |
| 6,091,205 A | 7/2000 | Newman, Jr. et al. | |
| D428,855 S | 8/2000 | Mayo et al. | |
| 6,120,262 A | 9/2000 | McDonough et al. | |
| D436,930 S | 1/2001 | Butler | |
| 6,169,377 B1 | 1/2001 | Bryde | |
| D437,585 S | 2/2001 | Mayo et al. | |
| D437,834 S | 2/2001 | Mayo et al. | |
| 6,218,787 B1 | 4/2001 | Murcko et al. | |
| D441,723 S | 5/2001 | Mayo et al. | |
| D442,558 S | 5/2001 | Mayo et al. | |
| D450,043 S | 11/2001 | Mosebrook | |
| D453,742 S | 2/2002 | Butler et al. | |
| 6,356,038 B2 | 3/2002 | Bishel | |
| D456,783 S | 5/2002 | Mayo et al. | |
| D461,782 S | 8/2002 | Butler et al. | |
| D465,460 S | 11/2002 | Mayo et al. | |
| D466,090 S | 11/2002 | Bennett | |
| D466,091 S | 11/2002 | Bennett | |
| D466,484 S | 12/2002 | Bennett | |
| 6,545,434 B2 | 4/2003 | Sembhi et al. | |
| D475,024 S | 5/2003 | Bennett | |
| D475,025 S | 5/2003 | Bennett | |
| 6,703,788 B1 | 3/2004 | Miller | |
| D490,061 S | 5/2004 | Bennett | |
| D510,074 S | 9/2005 | Larson et al. | |
| 6,969,959 B2 | 11/2005 | Black et al. | |
| D516,041 S | 2/2006 | Hobart et al. | |
| D535,950 S | 1/2007 | Alker et al. | |
| D538,238 S | 3/2007 | Alker et al. | |
| 7,190,125 B2 | 3/2007 | McDonough | |
| D539,758 S | 4/2007 | Blair et al. | |
| D542,226 S | 5/2007 | Spira | |
| D542,227 S | 5/2007 | Larson et al. | |
| D542,229 S | 5/2007 | Larson et al. | |
| D546,294 S | 7/2007 | Mayo et al. | |
| D546,776 S | 7/2007 | Mierta et al. | |
| D547,733 S | 7/2007 | Mayo et al. | |
| D547,734 S | 7/2007 | Mayo et al. | |
| D550,163 S | 9/2007 | Mayo et al. | |
| D550,164 S | 9/2007 | Mayo et al. | |
| D550,165 S | 9/2007 | Mayo et al. | |
| D550,166 S | 9/2007 | Mayo et al. | |
| D551,177 S | 9/2007 | Larson et al. | |
| D551,178 S | 9/2007 | Mayo et al. | |
| D551,179 S | 9/2007 | Mayo et al. | |
| D551,630 S | 9/2007 | Larson et al. | |
| D551,631 S | 9/2007 | Mayo et al. | |
| D552,042 S | 10/2007 | Mayo et al. | |
| D557,662 S | 12/2007 | Spira | |
| D557,664 S | 12/2007 | Hewson et al. | |
| D557,665 S | 12/2007 | Hewson et al. | |
| 7,365,282 B2 * | 4/2008 | Altonen et al. | 200/331 |
| D572,664 S | 7/2008 | Hollner et al. | |
| D572,665 S | 7/2008 | Hollner et al. | |
| D572,666 S | 7/2008 | Biery et al. | |
| D573,546 S | 7/2008 | Hollner | |
| D573,956 S | 7/2008 | Hollner et al. | |
| D574,787 S | 8/2008 | Hollner | |
| D576,958 S | 9/2008 | Hollner | |
| D580,881 S | 11/2008 | Hollner | |
| D580,882 S | 11/2008 | Hollner | |
| D580,883 S | 11/2008 | Hollner | |
| D580,884 S | 11/2008 | Hollner | |
| D585,840 S | 2/2009 | Hollner | |
| D585,841 S | 2/2009 | Hollner | |
| D586,760 S | 2/2009 | Hollner et al. | |
| D588,070 S | 3/2009 | Hollner et al. | |
| D588,071 S | 3/2009 | Hollner et al. | |
| D588,072 S | 3/2009 | Hollner et al. | |
| D588,073 S | 3/2009 | Hollner et al. | |
| D588,074 S | 3/2009 | Hollner | |
| D588,075 S | 3/2009 | Hollner | |
| D588,553 S | 3/2009 | Hollner et al. | |
| D595,663 S | 7/2009 | Hollner | |
| D595,665 S | 7/2009 | Hollner | |
| D595,666 S | 7/2009 | Hollner | |
| D596,140 S | 7/2009 | Hollner | |
| 7,609,007 B1 | 10/2009 | Kumar | |
| D604,743 S | 11/2009 | Altonen et al. | |
| D612,400 S | 3/2010 | Altonen et al. | |
| D613,305 S | 4/2010 | Altonen et al. | |
| 7,796,057 B2 | 9/2010 | Swatsky et al. | |
| D624,881 S | 10/2010 | Altonen et al. | |
| D624,882 S | 10/2010 | Altonen et al. | |
| D625,273 S | 10/2010 | Felegy et al. | |
| D633,448 S | 3/2011 | Biery et al. | |
| 7,928,663 B1 | 4/2011 | Kumar | |
| 2002/0060530 A1 | 5/2002 | Sembhi et al. | |
| 2005/0275354 A1 | 12/2005 | Hausman et al. | |
| 2005/0284738 A1 | 12/2005 | Altonen et al. | |
| 2006/0255745 A1 | 11/2006 | DeJonge | |
| 2007/0001654 A1 | 1/2007 | Newman | |
| 2007/0285027 A1 | 12/2007 | Gehman | |
| 2008/0024074 A1 | 1/2008 | Mosebrook | |
| 2008/0111501 A1 | 5/2008 | Dobbins et al. | |
| 2008/0237010 A1 | 10/2008 | Patel et al. | |
| 2009/0039854 A1 | 2/2009 | Blakely | |
| 2009/0108765 A1 | 4/2009 | Weightman et al. | |
| 2010/0214756 A1 | 8/2010 | Feldstein | |

OTHER PUBLICATIONS

Exhibit A—*Lutron Electronics* v. *Crestron Electronics* CV 2:09-cv-07, Third Amended Complaint, Feb. 2, 2011.

* cited by examiner

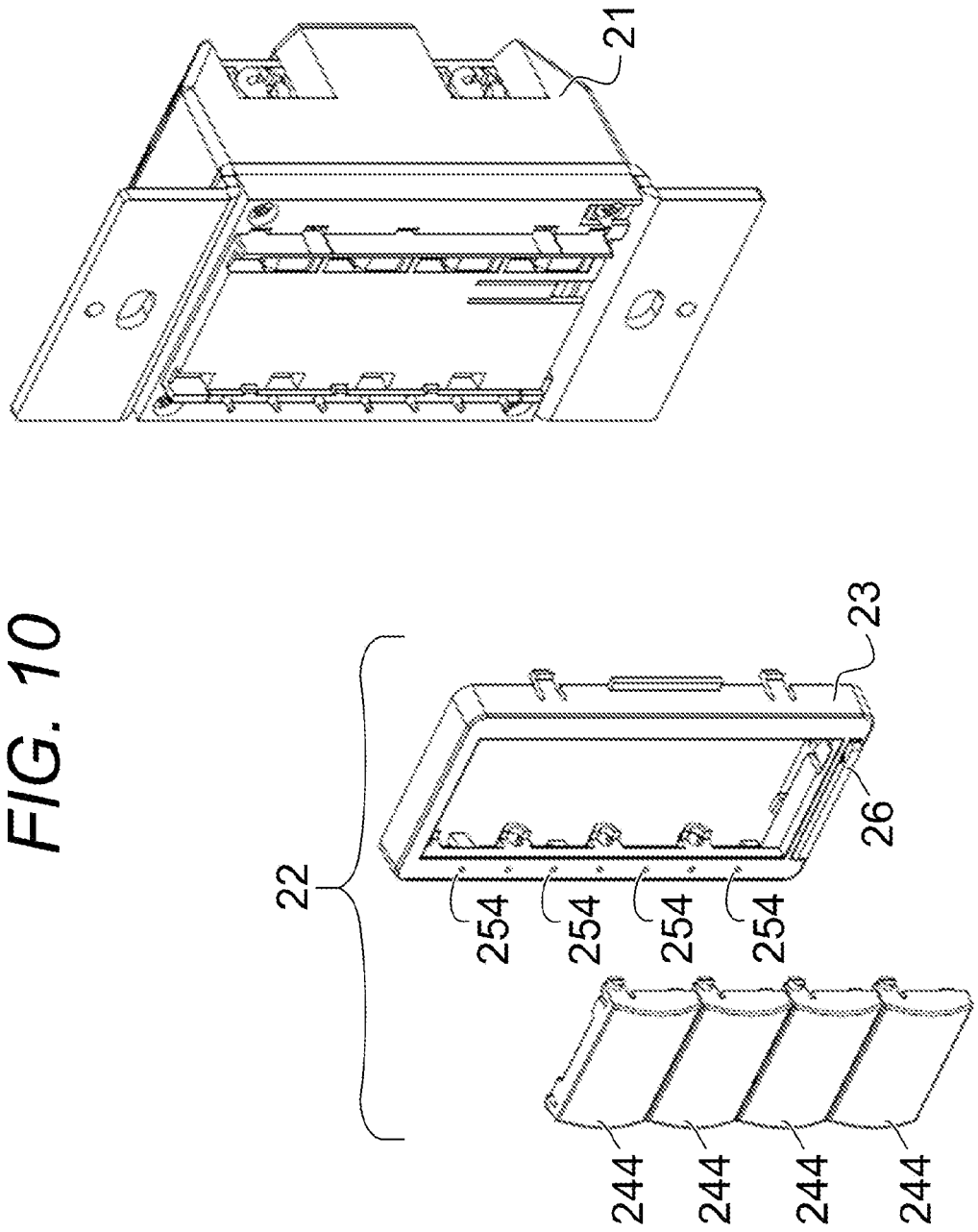

WALL BOX DIMMER

BACKGROUND OF THE INVENTION

1. Technical Field

This invention relates to wall box mounted lighting dimmers and more particularly relates to a dimmer having a bezel kit with a dual function air-gap switch and configurable buttons.

2. Background Art

Wall box dimmers are well known and frequently have a triac, a silicon controlled rectifier (SCR), a field effect transistor (FET), or any other controllably conductive semiconductor structure that is operable to deliver variable power to a lighting load. The controllably conductive device is frequently provided with an on/off control actuator and a dimmer level control actuator mounted in and operable from the front surface of the dimmer. It is required, in order to be "UL listed", to also provide an air-gap switch, which can be located in and operated from the same front surface of the device to provide a definite disconnect of the alternating-current (AC) power from the lighting load, independent of the off-time of the controllably conductive power device.

It is very desirable to organize the control actuators on the front surface of the dimmer to present an attractive smooth and uncluttered appearance while also being easy to configure with various combinations of buttons to allow ready customization.

The inventors have discovered that it would also be very desirable to utilize a required air-gap switch to provide additional functionality when it is not being used to interrupt an external AC load and to even combine a "night-light" feature into such a switch.

SUMMARY OF THE INVENTION

It is to be understood that both the general and detailed descriptions that follow are exemplary and explanatory only and are not restrictive of the invention.

A first object of the present invention is to provide a wall box dimmer having a generally planar face and adapted to mount behind a faceplate. The dimmer includes an enclosure, a pair of cooperating air-gap contacts configured as a microswitch mounted within the enclosure, and a removable color matched bezel kit including components protruding through an opening in the faceplate. The bezel kit further includes a bezel, a dual function air-gap switch actuator configured as a lever, and a vertical column of light emitting diodes. The dual function air-gap switch is mechanically co-operable with the pair of air-gap contacts and operates to open and close these contacts. The bezel kit is configured to allow various sized buttons operable by the user to initiate a primary function to be snapped into the bezel prior to attachment with the dimmer enclosure. The air-gap contacts are adapted to open when the bezel kit is separated from the dimmer enclosure. The dual function air-gap switch actuator is further adapted to be operable by the user to initiate an internal software reset.

A second object of the present invention is to provide a wall box dimmer having a generally planar face and adapted to mount behind a faceplate. The dimmer includes an enclosure, a pair of cooperating air-gap contacts configured as a microswitch mounted within the enclosure, and a removable color matched bezel kit including components protruding through an opening in the faceplate. The bezel kit further includes a bezel, a dual function air-gap switch actuator configured as a lever, and a vertical column of light emitting diodes. The dual function air-gap switch is mechanically co-operable with the pair of air-gap contacts and operates to open and close these contacts. The bezel kit is configured to allow various sized buttons operable by the user to initiate a primary function to be snapped into the bezel prior to attachment with the dimmer enclosure. The air-gap contacts are adapted to open when the bezel kit is separated from the dimmer enclosure. The dual function air-gap switch actuator is further adapted to be operable by the user to adjust stored lighting preset levels.

A third object of the present invention is to provide a wall box dimmer having a generally planar face and adapted to mount behind a faceplate. The dimmer includes an enclosure, a pair of cooperating air-gap contacts configured as a microswitch mounted within the enclosure, and a removable color matched bezel kit including components protruding through an opening in the faceplate. The bezel kit further includes a bezel, a dual function air-gap switch actuator configured as a lever, and a vertical column of light emitting diodes. The dual function air-gap switch is mechanically co-operable with the pair of air-gap contacts and operates to open and close these contacts. The bezel kit is configured to allow various sized buttons operable by the user to initiate a primary function to be snapped into the bezel prior to attachment with the dimmer enclosure. The air-gap contacts are adapted to open when the bezel kit is separated from the dimmer enclosure. The dual function air-gap switch actuator is further adapted to be operable by the user to provide a synchronization function with a centralized lighting controller.

The present invention seeks to overcome or at least ameliorate one or more of several problems, including providing secondary functions with adding additional switches to the face of a wall mounted dimmer.

DISCLOSURE OF INVENTION

To solve the aforementioned problem, a physical air-gap switch mechanism is provided, to be activated in special circumstances when an air-gap is needed. As activating the air-gap switch is not a typical behavior, it is advantageous to give this switch a secondary function since it is already occupying available space of the face of the dimmer.

BRIEF DESCRIPTION OF DRAWINGS

The accompanying figures further illustrate the present invention.

The components in the drawings are not necessarily drawn to scale, emphasis instead being placed upon clearly illustrating the principles of the present invention. In the drawings, like reference numerals designate corresponding parts throughout the several views.

BRIEF DESCRIPTION OF THE SEVERAL VIEWS OF THE DRAWING

Figure 1:
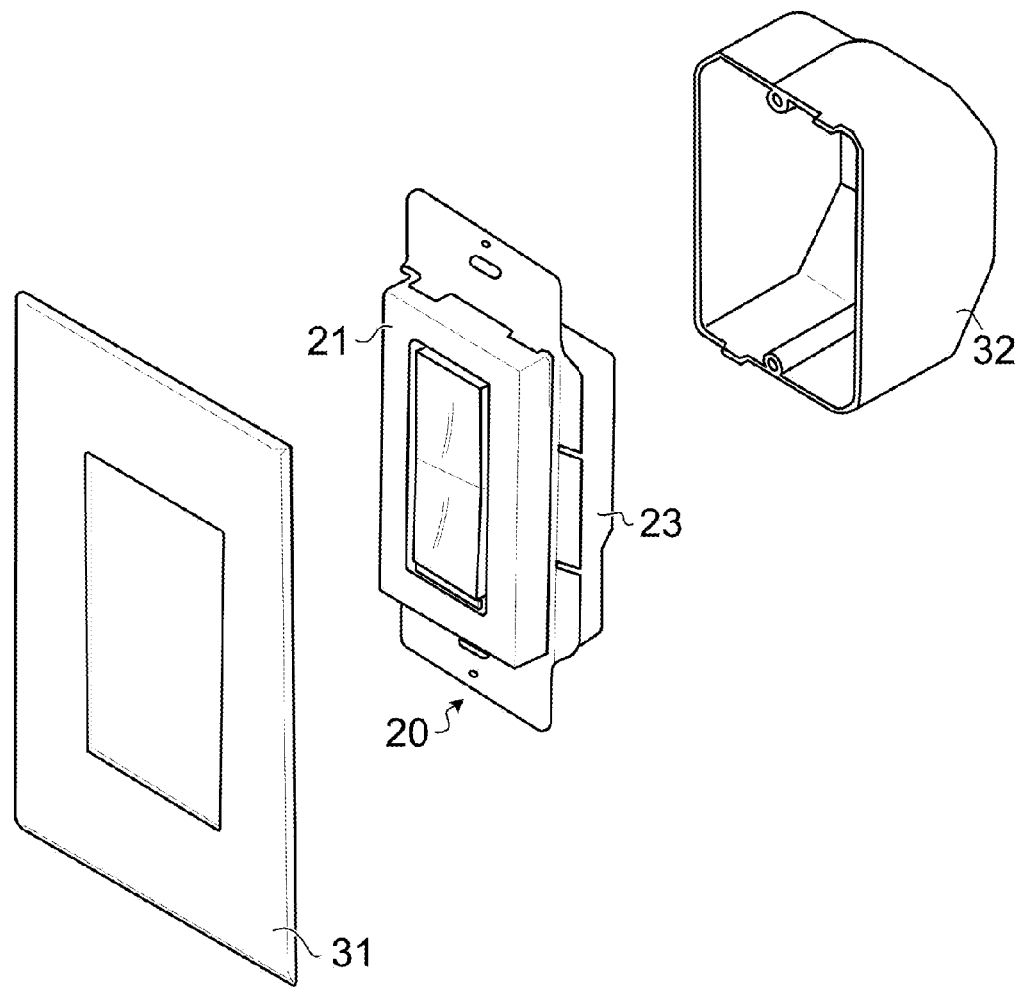

FIG. 1 is a perspective view of a wall box dimmer (with a decorative faceplate shown) and showing the novel dual function air-gap switch actuator in the closed "power on" position.

Figure 2:
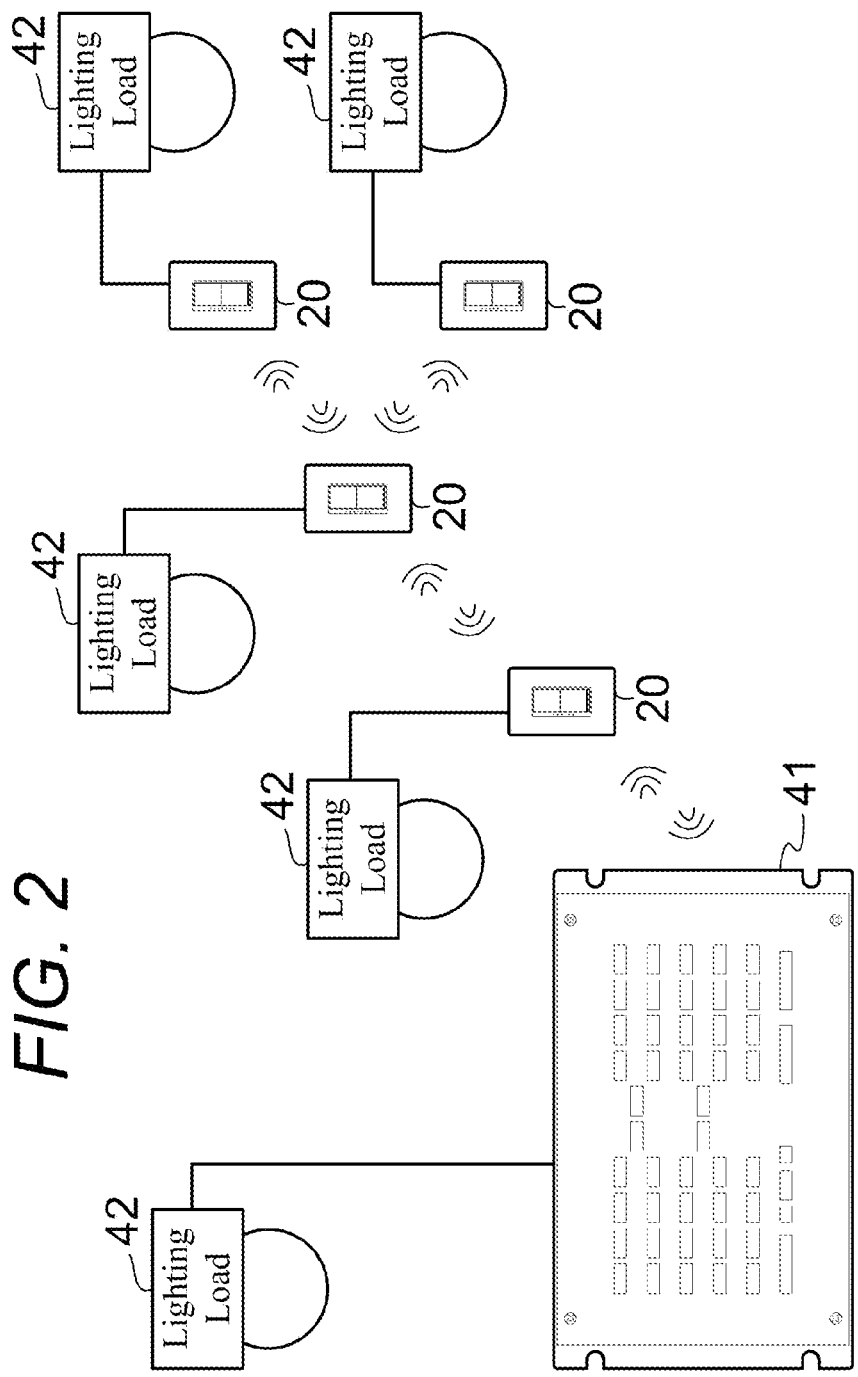

FIG. 2 is a wireless lighting system having a centralized lighting controller and incorporating the inventive wall dimmer of the present invention.

Figure 3:
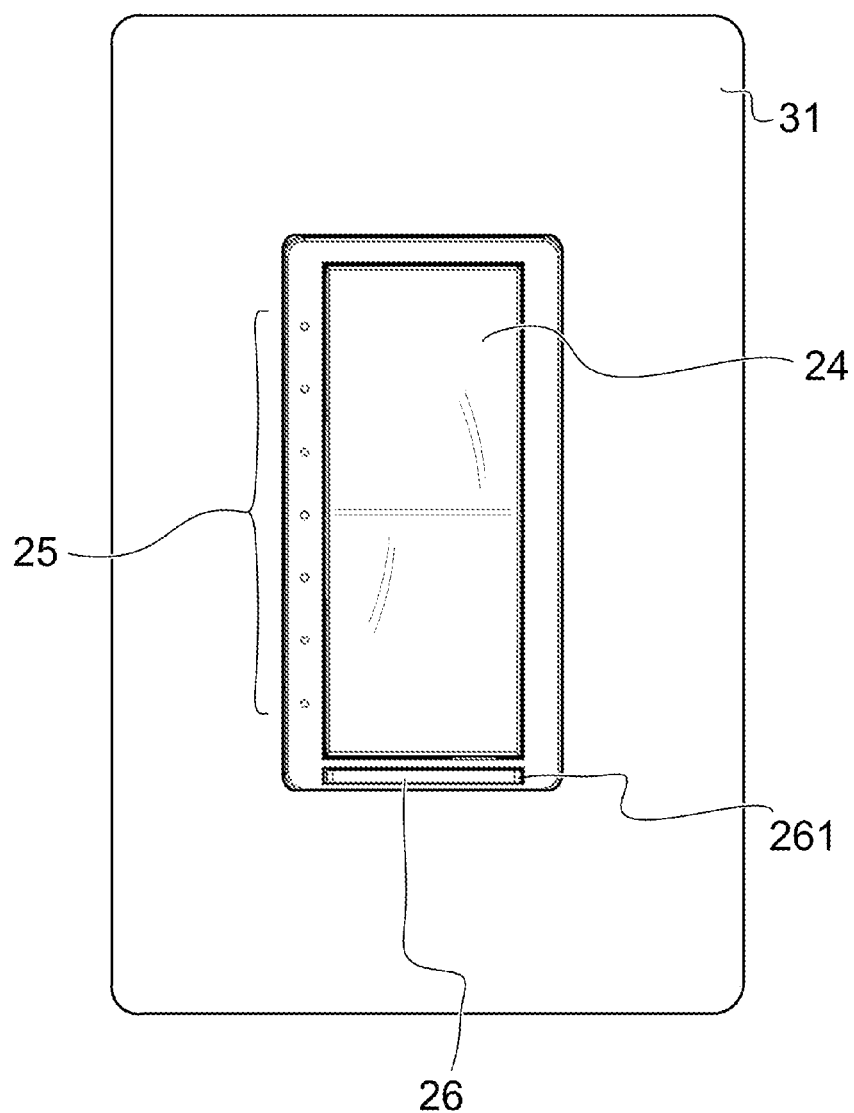

FIG. 3 a front view of the wall box dimmer shown in FIG. 1.

Figure 4:
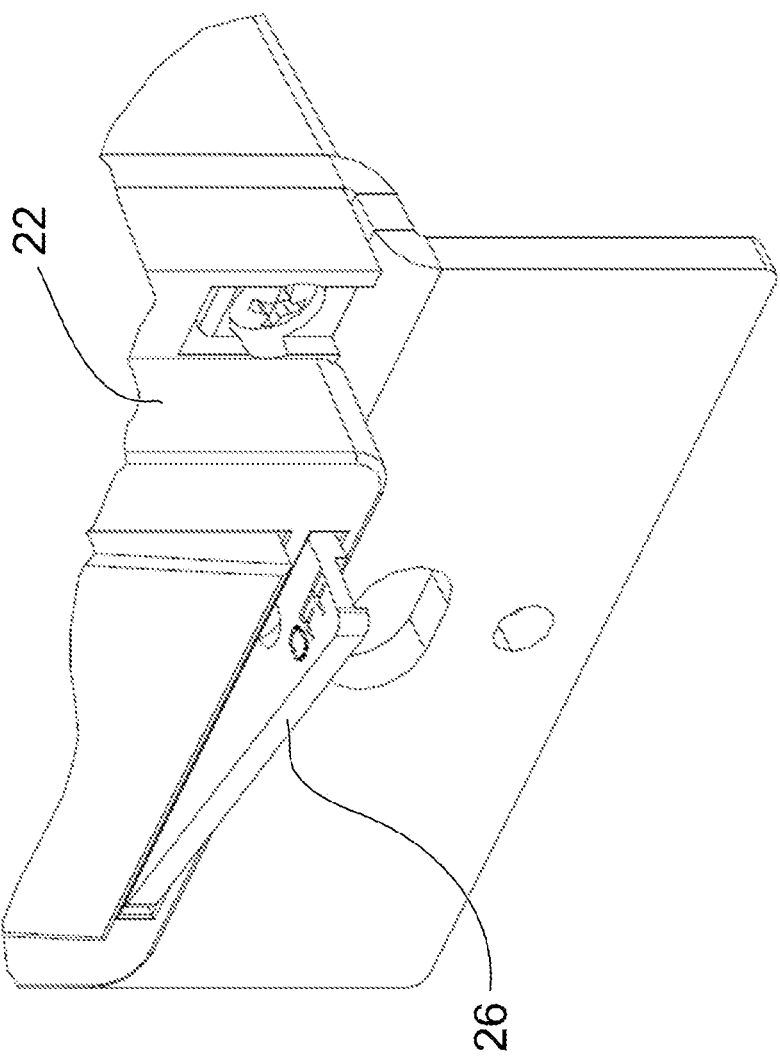
Figure 4:
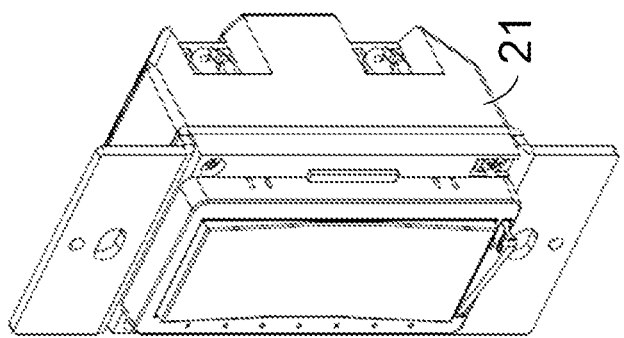

FIG. 4 further illustrates wall box dimmer of FIG. 1 showing the novel dual function air-gap switch actuator in the open "power off" position.

Figure 5:
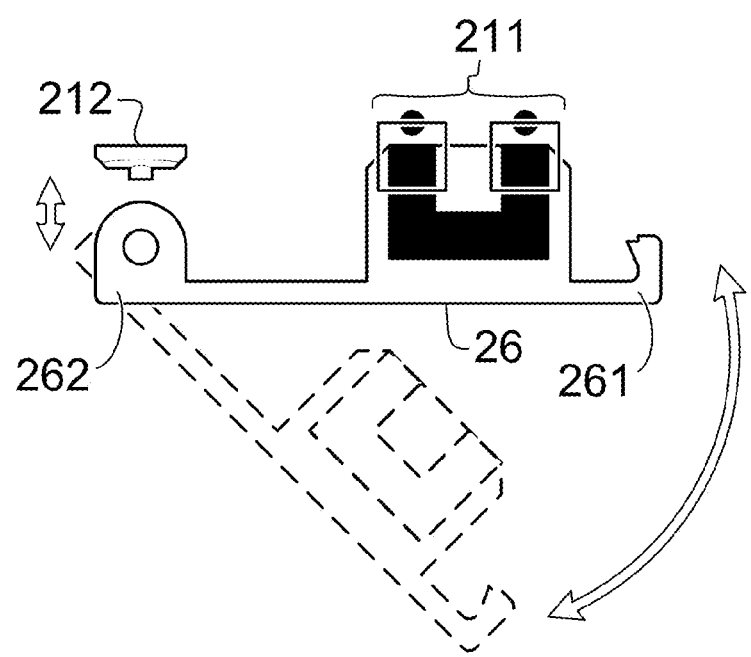

FIG. 5 further illustrates the dual function nature of the inventive switch actuator by depicting a second illustrative embodiment of the present invention.

Figure 6:
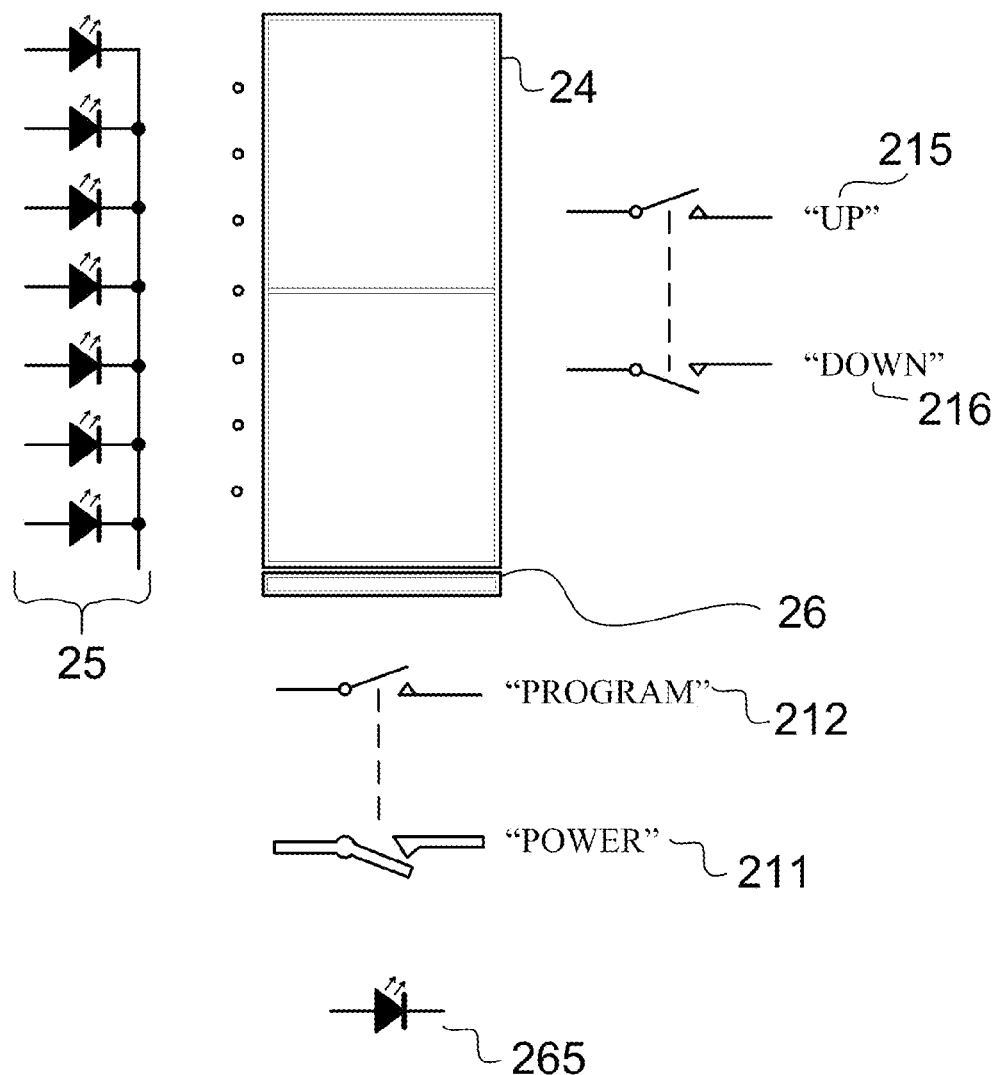

FIG. 6 schematically depicts certain electrical elements of the wall box dimmer shown in FIG. 1 according to one illustrative embodiment of the present invention.

Figure 7:
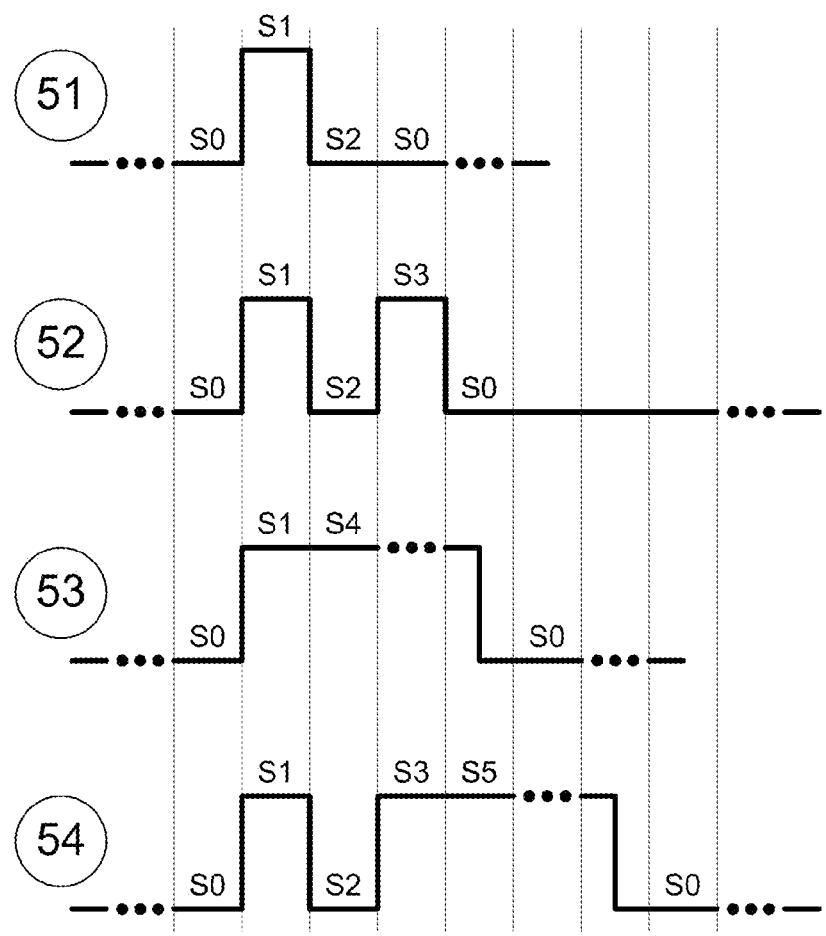

FIG. 7 depicts timing diagrams for several example commands operable for certain embodiments of the present invention.

Figure 8:
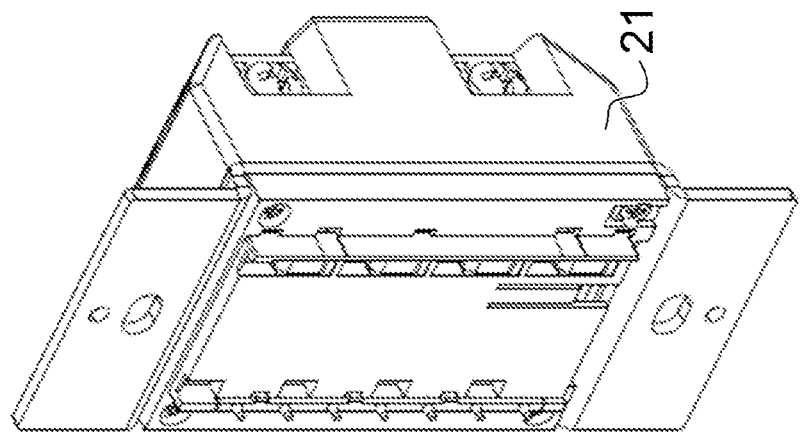
Figure 8:
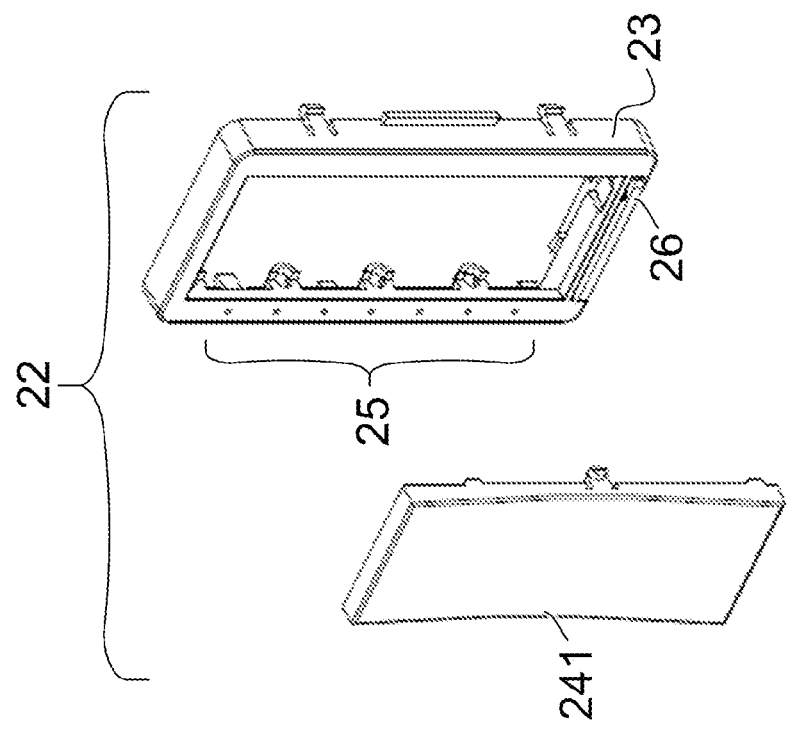

FIG. 8 depicts an embodiment of the inventive wall box dimmer having a single primary function button.

Figure 9:
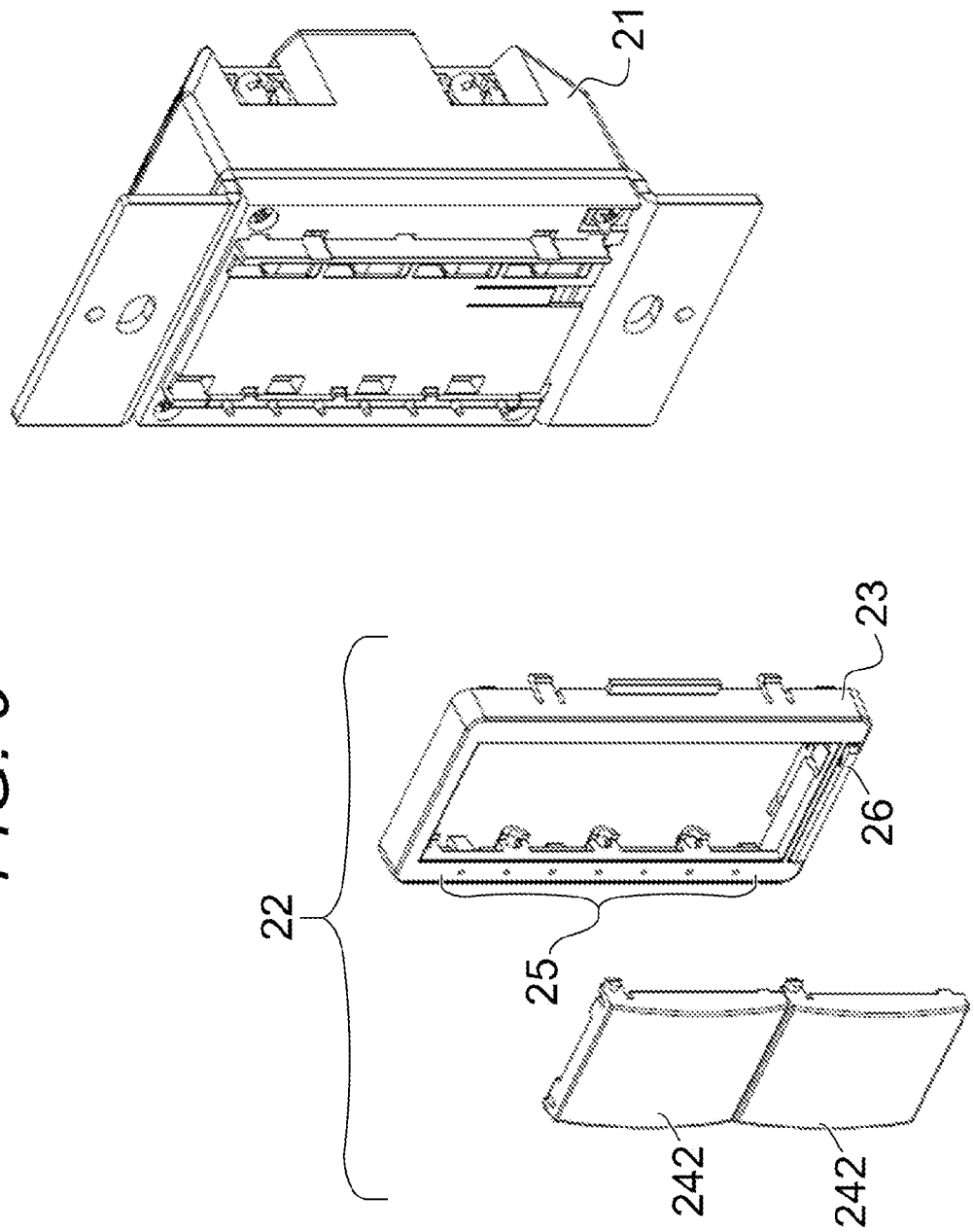

FIG. 9 depicts an embodiment of the inventive wall box dimmer having a two primary function buttons.

FIG. 10 depicts an embodiment of the inventive wall box dimmer having a four primary function buttons.

LIST OF REFERENCE NUMBERS FOR THE MAJOR ELEMENTS IN THE DRAWINGS

The following is a list of the major elements in the drawings in numerical order.
- 20 wall box dimmer(s)
- 21 enclosure (part of dimmer 20)
- 22 removable bezel kit (part of dimmer 20)
- 23 bezel (part of bezel kit 22)
- 24 primary function button (part of bezel kit 22)
- 25 vertical column of light emitting diodes (LED)
- 26 dual function air-gap switch actuator
- 31 faceplate
- 32 electrical wall box
- 41 centralized lighting controller
- 42 lighting load(s)
- 51 example first command—single increment increase (decrease) brightness
- 52 example second command—full brightness (dim)
- 53 example third command—step through increasing (decreasing) brightness increments
- 54 example fourth command—manually set continuous increasing (decreasing) brightness
- 211 air-gap contacts (main power disconnect)
- 212 secondary function switch (mounted within enclosure 21)
- 215 dimmer "up" switch (activated by primary function button 24)
- 216 dimmer "down" switch (activated by primary function button 24)
- 241 primary function button (single=1)
- 242 primary function button(s) (dual=2)
- 244 primary function button(s) (quad=4)
- 254 alternate LEDs (corresponding to buttons 244)
- 261 first end portion (of dual function air-gap switch actuator 26)
- 262 second end portion (of dual function air-gap switch actuator 26)
- 265 indicator lamp (integral to switch actuator 26)

DETAILED DESCRIPTION OF THE INVENTION

The present invention is generally implemented as part of a wall box dimmer. Hence, an illustrative dimmer system and its operation will be described initially.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

MODE(S) FOR CARRYING OUT THE INVENTION

The preferred embodiment of the present invention is described herein in the context of a wall box mounted dimmer, such as one that might be found in a residence, but is not limited thereto, except as may be set forth expressly in the appended claims.

Referring first to FIG. 1, there is shown a wall box dimmer 20, which has a generally planar bezel of any suitable material such as molded plastic and an enclosure 21 which includes various electronics components. According to the present invention, the bezel is actually a subcomponent of a removable bezel kit 22, which also other components which will be described below.

The wall box dimmer 20 is typically installed in an electrical wall box 32 as is well known to those skilled in the art of residential and commercial construction. The dimmer bezel extends through an opening in a faceplate 31. Those skilled in the art will recognize that faceplate 31 may be further comprised of a mounting plate portion and a snap-connect decorative faceplate portion. All of these parts can be manufactured from molded plastic.

FIG. 2 depicts a lighting system, such as might be used in either a small commercial or large residential installation, and which includes the inventive dimmer of the present installation. A centralized lighting controller 41 communicates with several wall box dimmers, such as the present inventive dimmer 20. Each of the dimmers 20 is associated with and controls a corresponding lighting load 42 and also provides an air gap switch to physically connect and disconnect the dimmer 20 with its corresponding lighting load 42. In certain embodiments, the centralized controller 41 is hard-wired to each of the dimmers 20 and in other embodiments; the dimmers intercommunicate with one another and the centralized controller 41 using a wireless mesh network wireless mesh network.

Advantageously, the additional secondary function added to the air-gap switch can be used to synchronize communications between the various lighting system components shown in FIG. 2.

FIG. 3 illustrates further detail of the components that comprise bezel kit 22, according to one embodiment of the present invention, as seen through the faceplate 31 such as in a typical residential installation. A primary dimming function for wall box dimmer 20 is activated by an operator using primary function button 24, such as for example a rocker actuator. Operator feedback, such as button status, dimming level, wireless network signal, or lighting system environmental 'green' level is indicated by a vertical indicator, such as a vertical column of light emitting diodes 25. The dual function air-gap switch actuator 26 allows for physical disconnect of the lighting load as described previously. In one embodiment of the present invention, the operator can depress a first end portion 261 of dual function air-gap switch actuator 26 to activate a secondary function, such as setting a default dimming schedule.

Refer now to FIG. 4 which shows a dual function air-gap switch actuator 26 in the open, power "OFF" position in accordance with one illustrative embodiment of the present invention. In this embodiment, the air-gap contacts internal to dimmer enclosure 21 are configured as a micro-switch which is opened and closed by rotary motion of air-gap switch actuator 26. Advantageously, in this embodiment, separating the bezel kit 22 from the enclosure 21 causes the air-gap contacts to open thereby protecting the user from exposure to potentially live electrical components.

In a preferred embodiment, the dual function air-gap switch actuator 26 is implemented as a small horizontal lever has been designed which, when rotated in one direction, opens a micro switch which physically disconnects the lighting load from the alternating current (AC) line. This lever sits directly below the device's buttons, and blends in aesthetically.

FIG. 5 further illustrates the dual function nature of the inventive switch actuator by depicting a second illustrative embodiment of the present invention. In this embodiment, the air-gap contacts 211 are conductively connected through the air-gap switch actuator 26 and are opened and closed by an operator grasping and pulling on the first end portion 261 of the dual function air-gap switch actuator 26 in a rotary fashion. A depression of a second end portion 262, of the dual function air-gap switch actuator 26, in a linear fashion activates a secondary function switch 212, mounted within enclosure 21. In other embodiments, the secondary function is activated by depressing the first end portion 261 of the dual function air-gap switch actuator 26 in a linear fashion. Significantly, the full front appearance of the entire assembly (with the dual function air-gap switch actuator 26 in the closed "power on" position and the internal dual function air-gap switch closed) is that of a substantially flat uncluttered surface. (See for example, the substantial planarity of the front surface in FIG. 1).

Other embodiments incorporate different configurations of air-gap contacts and different switch configurations for activating the secondary function. Advantageously, the secondary function is provided without requiring additional awkwardly placed switches or the like. This secondary function can include a number of functions, including but not limited to: (a) an internal software reset, (b) providing a "save" functionality when tapped to allow the end user to adjust stored lighting preset levels, or; (c) providing a synchronization function with a centralized lighting controller.

FIG. 6 depicts certain electrical elements of the inventive wall box dimmer 20 for one embodiment which incorporates a rocker actuator primary function button 24. This primary function button 24 can be alternately operated to depress either a dimmer "up" switch 215 or a dimmer "down" switch 216. The dual function air-gap switch actuator 26 can be alternately operated to either depress a secondary function switch 212 or to open and close air-gap contacts 211. Also shown is a vertical column of light emitting diodes (LED) 25. In a further embodiment of the present invention, an indicator lamp 265, such as a high efficiency LED lamp is incorporated into the dual function switch actuator 26.

Refer now to FIG. 7 and continue to refer to FIG. 6. A timing diagram associated with one illustrative embodiment of the present invention is provided to describe several example commands executed by dimmer 20. The reference characters "S1", "S2", "S3", "S4", and "S5" indicate a set of internal states that can be used to determine the particular desired command in accordance with an illustrative embodiment of the present invention.

Four example commands, operable from the dimmer "up" switch 215, are shown. The example first command 51 consists of a short single tap (i.e. "single-click") on the dimmer "up" switch 215 and acts to increase the brightness of a controlled lighting load to the next programmed increment. An example second command 52 consisting of a short double tap (i.e. "double-click") acts to increase the controlled lights to their maximum brightness. An example third command 53 consisting of a continuous depression of the dimmer "up" switch 215 causes the brightness to step through a sequence of programmed brightness levels, such as at a rate of ten (10) brightness levels per second.

Finally, an example fourth command 54 consisting of a single short tap immediately followed by continuous depression causes the brightness to continuously increase through all brightness levels at a predetermined rate. In this embodiment, a short depression of the dual function air-gap switch actuator 26 (i.e. "single-click") activates the secondary function which in turn causes the manually set brightness level to be added to the programmed sequence of brightness levels. In this embodiment, the dimmer "down" switch 216 switch operates in an analogous manner.

FIGS. 8, 9, and 10 illustrate several embodiments of the inventive dimmer in which various configurations of buttons have been incorporated into the bezel kit 23. Advantageously, the particular button configuration can be altered without removing the wall box dimmer 20 from the electrical wall box 31, shown in FIG. 1. Changing button configurations is accomplished by simply removing the bezel kit and changing out the buttons.

The button functions, with the exception of the air-gap switch contacts, are all software configurable. For example, in certain embodiments, multiple secondary functions are provided by the dual function switch actuator 26: (a) a single short tap stores the present lighting level as a preset; and (b) a continuous resets the programmed brightness levels to factory set defaults or downloads the default levels from a central lighting controller.

Refer now to FIG. 8. The wall box dimmer consists of enclosure 21 and attached bezel kit 22. Bezel kit 22 consists of a bezel 23 that includes a vertical column of LEDs 25 and the inventive dual function switch actuator 26. In this embodiment, one primary function button 241 is installed within bezel 23 and the vertical column of LEDs 25 is configured as a bar graph indicator which indicates the commanded lighting level.

In the embodiment shown in FIG. 9, two primary function buttons 242; are installed within bezel 23 and the vertical column of LEDs 25 is configured as a bar graph indicator which indicates the commanded lighting level. As described previously, bezel kit 22 includes the bezel 23 and the inventive dual function switch actuator 26.

In the embodiment shown in FIG. 10, four primary function buttons 244; are installed within bezel 23 and the bezel kit 22 further includes the bezel 23, the inventive dual function switch actuator 26, and the vertical column of LEDs 25. In this embodiment, the vertical column of LEDs includes seven LEDs, spaced to line up with the primary function buttons. More specifically, alternate LEDs 254 are aligned with corresponding primary function buttons and the remaining LEDs that are not aligned with corresponding buttons are powered off.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

INDUSTRIAL APPLICABILITY

To solve the aforementioned problems, the present invention is a unique dual function air-gap switch configuration that incorporates additional functionality while still maintaining the required air-gap switch functionality in the same physical space constraint.

LIST OF ACRONYMS IN THE DETAILED DESCRIPTION

The following is a list of the acronyms used in the specification in alphabetical order.
AC alternating current
FET field effect transistor
LED light emitting diode
SCR silicon controlled rectifier

ALTERNATE EMBODIMENTS

Alternate embodiments may be devised without departing from the spirit or the scope of the invention. For example, additional indicator lamps could be incorporated into the dual function air-gap switch actuator.

What is claimed is:

1. A wall box dimmer having a generally planar face and adapted to mount behind a faceplate (31), said dimmer comprising:
   (a) an enclosure (21) containing a pair of cooperating air-gap contacts (211) interiorly thereof;
   (b) a removable bezel kit (22) protruding through an opening in said faceplate and further comprising
      (i) a bezel,
      (ii) at least one primary function button (24) operable by a user to initiate a primary function,
      (iii) a dual function air-gap switch actuator (26) mechanically co-operable with said pair of air-gap contacts and adapted to open and close said pair of air-gap contacts; and
   (c) wherein the dual function air-gap switch actuator is further adapted to be operable by the user to initiate an internal software reset and the bezel kit is configured to allow various sized buttons to be snapped into the bezel prior to attachment with the dimmer enclosure.

2. A wall box dimmer having a generally planar face and adapted to mount behind a faceplate, said dimmer comprising:
   (a) an enclosure containing a pair of cooperating air-gap contacts interiorly thereof;
   (b) a removable bezel kit protruding through an opening in said faceplate and further comprising
      (i) a bezel,
      (ii) at least one primary function button operable by a user to initiate a primary function,
      (iii) a dual function air-gap switch actuator mechanically co-operable with said pair of air-gap contacts and adapted to open and close said pair of air-gap contacts; and
   (c) wherein the dual function air-gap switch actuator is further adapted to be operable by the user to adjust stored lighting preset levels and the bezel kit is configured to allow various sized buttons to be snapped into the bezel prior to attachment with the dimmer enclosure.

3. The wall box dimmer of claim 2 wherein the dual function air-gap switch actuator provides a save functionality when tapped to allow the end user to adjust stored lighting preset levels.

4. The wall box dimmer of claim 3 wherein the at least one primary function button is configured to raise light levels to a desired level and the dual function air gap switch is configured to adjust stored lighting preset level to the desired level.

5. A wall box dimmer having a generally planar face and adapted to mount behind a faceplate (31), said dimmer comprising:
   (a) an enclosure (21) containing a pair of cooperating air-gap contacts (211) interiorly thereof;
   (b) a removable bezel kit (22) protruding through an opening in said faceplate and further comprising
      (i) a bezel,
      (ii) at least one primary function button (24) operable by a user to initiate a primary function,
      (iii) a dual function air-gap switch actuator (26) mechanically co-operable with said pair of air-gap contacts and adapted to open and close said pair of air-gap contacts; and
   (c) wherein the dual function air-gap switch actuator is further adapted to be operable by the user to provide a synchronization function with a centralized lighting controller and the bezel kit is configured to allow various sized buttons to be snapped into the bezel prior to attachment with the dimmer enclosure.

* * * * *